(12) United States Patent
Hofmeister et al.

(10) Patent No.: US 7,572,092 B2
(45) Date of Patent: Aug. 11, 2009

(54) SUBSTRATE ALIGNMENT SYSTEM

(75) Inventors: Christopher A. Hofmeister, Hampstead, NH (US); Mark Saunders, Tokyo (JP)

(73) Assignee: Brooks Automation, Inc., Chelmsford, MA (US)

( * ) Notice: Subject to any disclaimer, the term of this patent is extended or adjusted under 35 U.S.C. 154(b) by 103 days.

(21) Appl. No.: 10/266,072

(22) Filed: Oct. 7, 2002

(65) Prior Publication Data
US 2004/0067127 A1 Apr. 8, 2004

(51) Int. Cl.
*B25J 19/02* (2006.01)
(52) U.S. Cl. ............. 414/744.5; 294/907; 414/937
(58) Field of Classification Search ............ 414/744.5, 414/217, 416.01, 416.03, 416.08, 937; 294/907
See application file for complete search history.

(56) References Cited

U.S. PATENT DOCUMENTS

| | | | |
|---|---|---|---|
| 4,766,322 A * | 8/1988 | Hashimoto | 250/561 |
| 5,535,306 A | 7/1996 | Stevens | 395/89 |
| 5,537,311 A | 7/1996 | Stevens | 364/167.01 |
| 5,605,428 A * | 2/1997 | Birkner et al. | 414/331 |
| 5,740,059 A * | 4/1998 | Hirata et al. | 364/478.01 |
| 5,899,658 A | 5/1999 | Hofmeister | 414/744.5 |
| 6,032,083 A * | 2/2000 | Oosawa | 700/218 |
| 6,491,491 B1 * | 12/2002 | Tsuneda et al. | 414/744.5 |

OTHER PUBLICATIONS

CCD Laser Displacement Sensor, LK Series pp. 1-6, 1997.

* cited by examiner

*Primary Examiner*—Donald Underwood
(74) *Attorney, Agent, or Firm*—Richard Pickreign; Perman & Green, LLP

(57) ABSTRACT

A system for aligning an end effector with a substrate in a substrate transport apparatus. The system comprises a first sensor connected to the end effector and a controller for moving the substrate transport apparatus. The sensor has a sensing path pointed in an outward direction. The sensing path does not intersect the substrate when the substrate is located on the end effector. The controller for moving the substrate transport apparatus moves the substrate transport apparatus, based at least partially upon input from the sensor, to position the end effector at a predetermined position relative to the substrate to pick up the substrate onto the end effector.

16 Claims, 16 Drawing Sheets

SUBSTRATE ALIGNMENT SYSTEM

BACKGROUND OF THE INVENTION

1. Field of the Invention

The present invention relates to substrate processing apparatus and, more particularly, to alignment systems and methods used for moving substrates.

2. Prior Art

U.S. Pat. Nos. 5,535,306 and 5,537,311 disclose systems and methods for aligning substrates. A problem with prior art substrate alignment systems and methods is that they are relatively slow thereby slowing down throughput of multiple substrates. It is an object of the present invention to increase throughput of substrate by providing faster substrate alignment methods and systems than were available in the prior art.

SUMMARY OF THE INVENTION

In accordance with one embodiment of the present invention, a system for aligning an end effector with a substrate in a substrate transport apparatus is provided. The system comprises a first sensor connected to the end effector and a controller for moving the substrate transport apparatus. The sensor has a sensing path pointed in an outward direction. The sensing path does not intersect the substrate when the substrate is located on the end effector. The controller for moving the substrate transport apparatus moves the substrate transport apparatus, based at least partially upon input from the sensor, to position the end effector at a predetermined position relative to the substrate to pick up the substrate onto the end effector.

In accordance with another embodiment of the present invention, a system is provided for sensing positions of substrates. The system comprises a first distance sensor for sensing a distance between the first sensor and an edge of a first one of the substrates; and a vertical movement system for vertically moving the first distance sensor relative to a second one of the substrates for subsequently sensing a distance between the first sensor and an edge of the second substrate.

In accordance with another embodiment of the present invention, a substrate transport apparatus is provided comprising a robot arm assembly and an end effector connected to the robot arm assembly at a wrist location. The improvement comprises a substrate sensor located proximate the wrist location for sensing a position of a substrate relative to the sensor.

In accordance with another embodiment of the present invention, a substrate transport apparatus is provided comprising a robot arm assembly and an end effector connected to the robot arm assembly. The improvement comprises a first substrate sensor located at a front facing distal tip of the end effector.

In accordance with another embodiment of the present invention, a substrate transport apparatus is provided comprising a drive section and a movable arm assembly connected to the drive section, the arm assembly comprising a robot arm connected to the drive section and an end effector connected to the robot arm. The improvement comprises at least one substrate sensor connected to the substrate transport apparatus and spaced from the end effector, wherein the end effector can be moved without moving the sensor, and wherein the sensor is movable to be moved to different locations.

In accordance with another embodiment of the present invention, a system is provided for aligning a substrate after the substrate has been picked up by a substrate holder. The improvement comprises at least three sensors for sensing edges of the substrate, wherein the substrate holder is moved based at least partially upon input from the three sensors.

In accordance with another embodiment of the present invention, a system is provided for aligning a substrate holder with a substrate. The improvement comprises at least one capacitive sensor on the substrate holder for sensing an edge of the substrate, wherein the substrate holder is moved based at least partially upon input from the sensor.

In accordance with one method of the present invention, a method of sensing positions of substrates comprising steps of sensing a first edge of a first one of the substrates by a sensor without moving the first substrate; moving the sensor; and sensing a first edge of a second one of the substrates by the sensor without moving the second substrate. Positions of both the first and second substrates are sensed by the sensor without moving the first and second substrates.

In accordance with another method of the present invention, a method of aligning substrates comprising steps of scanning positions of respective first edges of at least two of the substrates; subsequently moving the at least two substrates; and aligning the substrates as the substrates are moved. The step of scanning occurs before the at least two substrates are subsequently moved.

BRIEF DESCRIPTION OF THE DRAWINGS

The foregoing aspects and other features of the present invention are explained in the following description, taken in connection with the accompanying drawings, wherein:

FIG. 8B is a schematic top plan view as in FIG. 8A with the substrate located in a cassette;

DETAILED DESCRIPTION OF THE PREFERRED EMBODIMENTS

Figure 1:
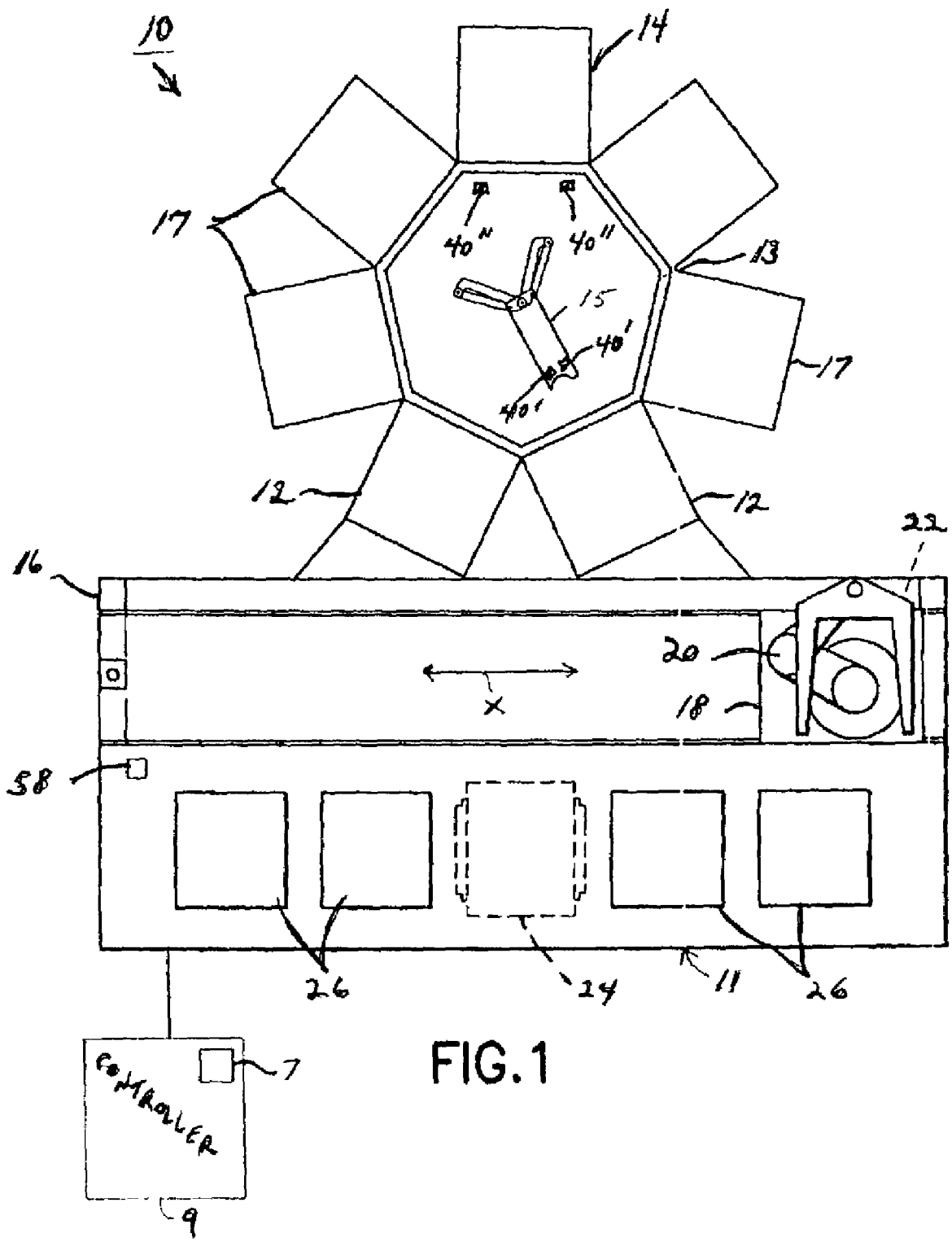
FIG. 1 is a schematic top plan view of a substrate processing apparatus incorporating features of the present invention.

Referring to FIG. 1, there is shown a schematic top plan view of an apparatus 10 incorporating features of the present invention. Although the present invention will be described with reference to the embodiments shown in the drawings, it should be understood that the present invention can be embodied in many alternate forms of embodiments. In addition, any suitable size, shape or type of elements or materials could be used.

The apparatus 10 is a substrate processing apparatus for processing flat panel display substrates. However, the apparatus could be used to process any suitable type of substrate including semiconductor wafers. The apparatus 10 generally comprises a substrate processing device 14 and a substrate transport or transfer device 11.

Substrate processing device 14 generally comprises a main transport chamber 13, load locks 12, a substrate transport robot 15, and substrate processing chambers 17. Examples of substrate processing devices are described in U.S. Pat. Nos. 4,715,921 and 5,512,320 which are hereby incorporated by reference in their entireties.

Transfer device 11 is shown connected to load locks 12 of substrate processing device 14. In alternate embodiments, transfer device 11 could be configured to work with any suitable type of substrate processing device. Transfer device 11 generally comprises a frame 16, a car 18, a robot 20, a drive 22, an optional aligner 24, and means for removably holding substrate cassettes 26.

Transfer device 11 serves the function of removing substrates from cassettes 26 and inserting them into substrate processing device 14 at load locks 12. Once substrate processing device 14 is finished processing a substrate, transfer device 11 is used to return the substrate from load lock 12 back to cassette 26. An operator can remove cassette 26 after it has been filled with processed substrates and insert a new cassette of unprocessed substrates in its place. Transfer device 11 can be adapted to hold any suitable member of cassettes 26.

Transfer device 11 may operate in atmospheric pressure, but could be used in other pressure situations, such as in a vacuum. Transfer device 11 might also have a substrate buffer. Transfer device 11 is connected to a computer controller 9 which controls movement of car 18 relative to frame 16 and controls movement of robot 20.

Figure 2F:
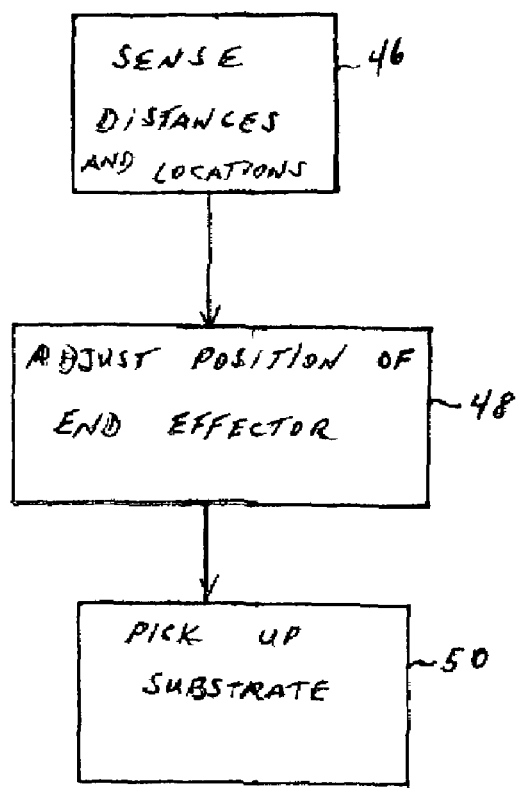
FIG. 2F is a flow chart of steps used to perform one method of the present invention.
Figure 2A:
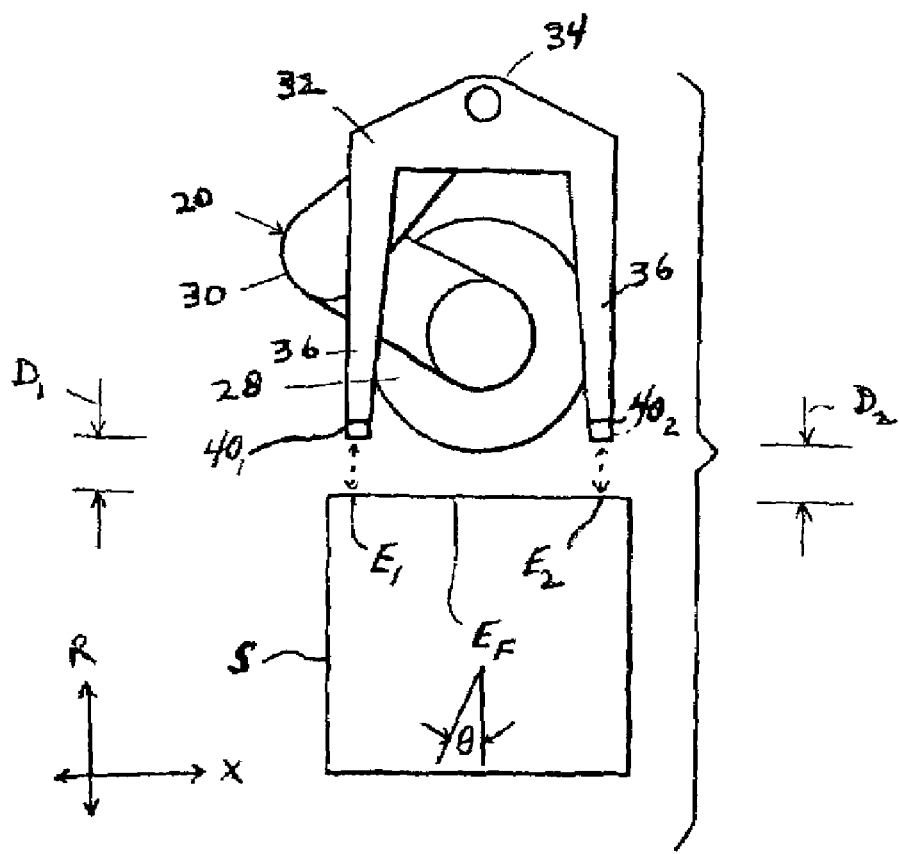
FIG. 2A is a schematic top plan view of the substrate transport apparatus shown in FIG. 1 with the substrate transport apparatus at a position in front of the substrate for sensing the front edge of the substrate and for subsequent movement to pick up the substrate.

Referring also to FIG. 2A, robot 20 generally comprises a drive section 28, a movable arm 30, and an end effector 32. End effector 32 is adapted to hold a substrate thereon. End effector 32 is attached to an end of arm 30. Drive section 28 is adapted to move arm 30 to thereby move end effector 32 into and out of cassettes 26 and load locks 12. In alternate embodiments, any suitable type of robot could be used.

Returning to FIG. 1, robot 20 is mounted to car 18. Car 18 is movably mounted to frame 16. Car 18 can move along frame 16 in direction X. Car 18 forms a mounting housing for mounting robot 20 to frame 16 as a shuttle or track movement system. Car 18 has bearings or wheels. Frame 16 has front and rear track sections. The bearings and track sections, similar to a railroad track system, allow car 18 to move along frame 16 on a predetermined confined path. In an alternate embodiment, a multi-section track system could be used with switches or turnouts. Car 18 has a center hole for receiving drive section 28 of robot 20 therein. A mounting flange of the robot 20 is located on top of the top surface of the car 18 and fixed thereto, such as by screws. A similar track system is described in U.S. patent application Ser. No. 08/891,523 which is hereby incorporated by reference in its entirety. However, any suitable robot transport system could be used, or the drive section could be located at a substantially stationary location on the frame.

The drive section 28 may be a coaxial shaft drive such as described in U.S. Pat. No. 5,899,658 which is hereby incorporated by reference in its entirety. However, any suitable drive section could be used.

In the embodiment shown in FIG. 2A, the robot arm is shown as a scara arm. However, any suitable movable arm assembly could be provided. The end effector 32 is controllably rotatably connected to the movable arm 30 at a wrist location 34. The end effector 32 includes two arms 36 for supporting a substrate S thereon.

Figures 2B, 2C:
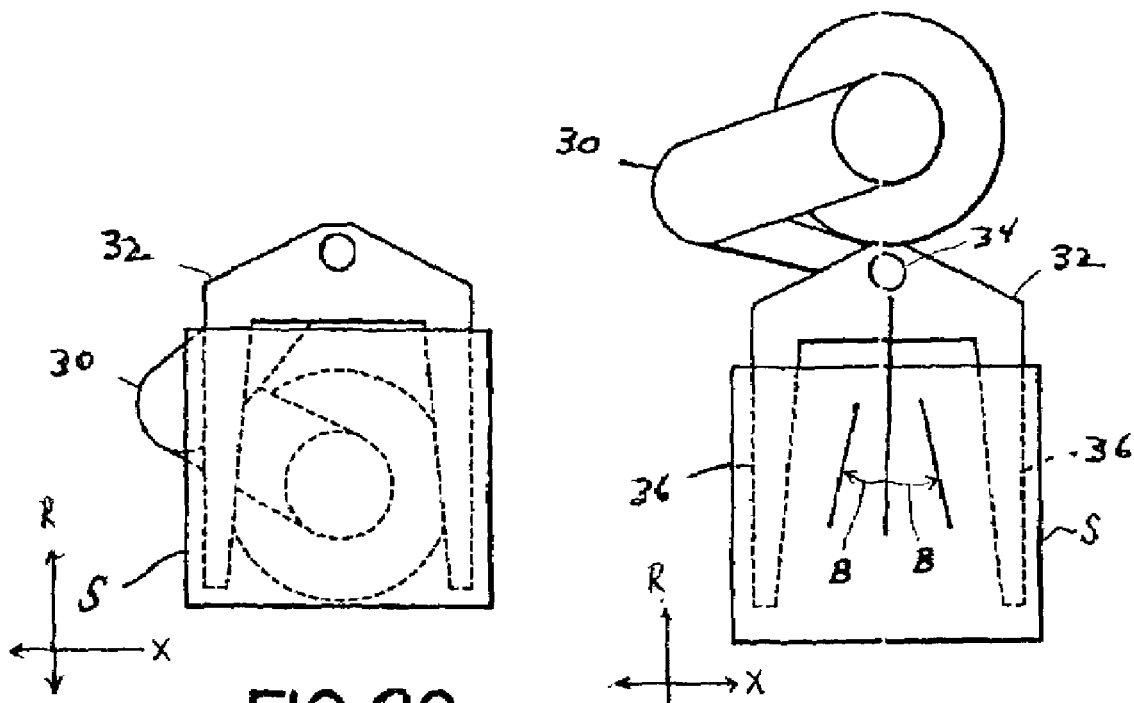
FIG. 2B is a schematic top plan view as in FIG. 2A with the end effector moved to an extended position under the substrate.
FIG. 2C is a schematic top plan view as in FIG. 2B with the substrate having been picked up by the end effector and the end effector moved back to a retracted home position.

As seen with reference to FIGS. 2A-2C, the robot 20 can be positioned in front of one of the substrates S. The arm 30 can then be moved to an extended position to move the end effector 32 under the substrate S. The robot 20 then lifts the end effector 32 to support the substrate S on the top surface of the arms 36 (or standoffs on the arms 36). The movable arm 30 is then moved back to its home retracted position as shown in FIG. 2C with the substrate S being moved with the end effector 32. As explained in the U.S. Pat. Nos. 5,535,306 and 5,537,311, which are hereby incorporated by reference in their entireties, a problem exists in that the substrates may be misaligned before they are picked-up by the end effector.

There are generally three methods that can be used to correct misalignment. First, the end effector can be aligned with the substrate before the substrate is picked-up by the end effector. Second, the end effector can be controlled to place the substrate at a target location in an aligned position even though the substrate was picked-up misaligned on the end effector. Third, a separate aligner station can be used to align the substrate.

Figure 1A:
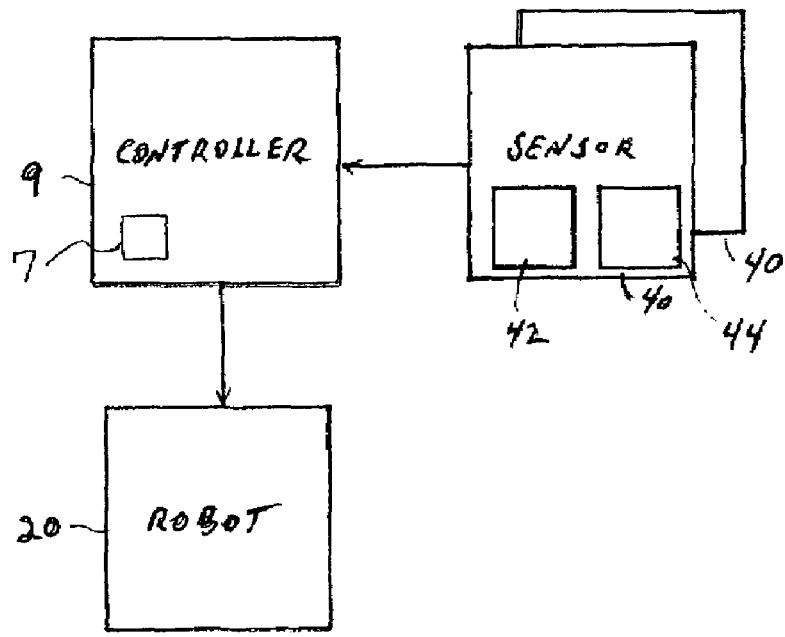
FIG. 1A is a schematic diagram of portions of the alignment system used in the apparatus shown in FIG. 1.

Referring to FIG. 2A, the end effector 32 comprises two sensors $40_1$ and $40_2$. In this embodiment sensors $40_1$ and $40_2$ are located at the distal tips at the front ends of end effector arms 36. However, in alternate embodiments more or less than two sensors could be provided on the end effector 32, and the sensors could be located at any suitable location on the end effector 32 or robot 20. In this embodiment, sensors $40_1$ and $40_2$ are comprised of distance measuring sensors. Referring to FIG. 1A, in this embodiment, the distance measuring sensors may comprise an energy emitter 42, such as a laser, and a receiver 44. Energy is emitted from energy emitter 42 and reflected back to receiver 44. In a preferred embodiment sensors $40_1$ and $40_2$ are laser displacement meters. An example of such a sensor is an LK Series charge coupled device (CCD) Laser Measurement System sold by Keyence, which is a high-accuracy, semiconductor laser based triangulation measurement system with 1.0 micron resolution. CCD sensors are advantageous in that they are relatively inexpensive and have a fast response time. It should be understood that any suitable type of sensor could be used. For example, in alternate embodiments the sensors could be other types of optical triangulation sensors, ultrasonic sensors, infra-red sensors, or capacitive sensors.

Returning to FIG. 2A, the end effector 32 is positioned in front of the substrate S, locating sensors $40_1$ and $40_2$ in front of the front edge $E_F$ of the substrate. Sensors $40_1$ and $40_2$ then measure or sense distances $D_1$ and $D_2$, respectively, between sensors $40_1$ and $40_2$ and front edge $E_F$ at reference points $E_1$ and $E_2$.

Figure 2E:
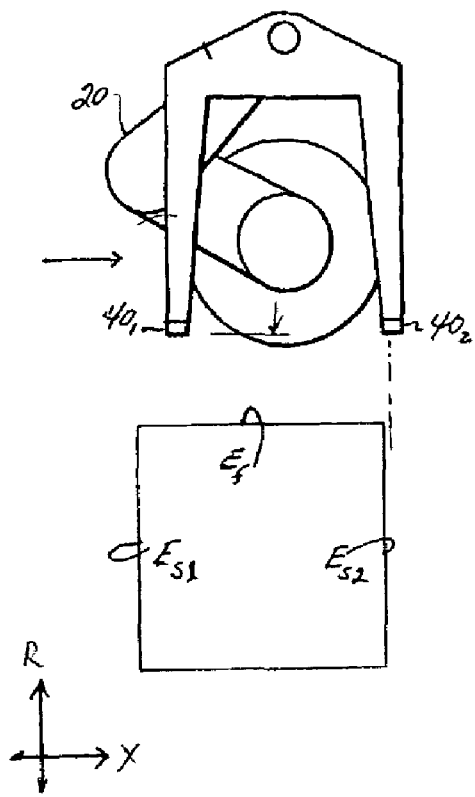
FIG. 2E is a schematic top plan view as in FIG. 2A with the substrate transport apparatus at a position in front of the substrate for sensing another side edge of the substrate.
Figure 2D:
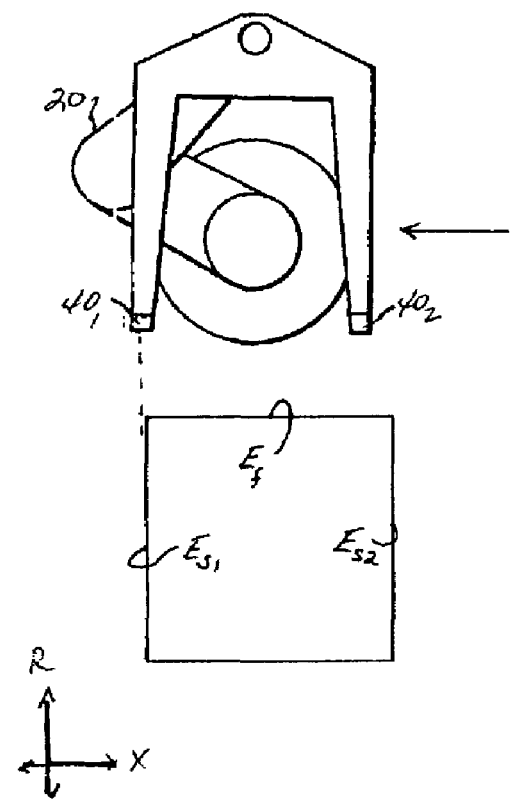
FIG. 2D is a schematic top plan view as in FIG. 2A with the substrate transport apparatus at a position in front of the substrate for sensing a side edge of the substrate.

Referring to FIG. 2D, robot 20 may also travel along direction X until sensor $40_1$ detects an end of front edge $E_F$, thus identifying the location of side edge $E_{S1}$. Controller 9 could be programmed to determine the location of $E_{S1}$ when the measured distance exceeds a predetermined maximum distance. At this point, if the length of front edge $E_F$ is known, the location of substrate S along direction X can be determined. In the event that the length of front edge $E_F$ is not known, robot 20 may then travel in the opposite direction along direction X until sensor $40_2$ detects the opposite end of front edge $E_F$, and in the process, identifies the location of side edge $E_{S2}$ as shown in FIG. 2E.

Distances $D_1$ and $D_2$ may be used to determine any angular misalignment θ and any misalignment in the R direction of substrate S.

A difference between distances $D_1$ and $D_2$ could indicate an angular misalignment. A distance $D_1$ or $D_2$ above or below a predetermined distance may indicate that substrate S is misaligned in the R direction. The detected locations of side edges $E_{S1}$ and $E_{S2}$ can be used to determine any substrate misalignment in the X direction.

With regard to the present invention, it should be understood that the R direction may be referred to as a radial direction, and is generally in a plane parallel to a plane defined by a top surface of end effector 32. It should also should be understood that the X direction is a direction perpendicular to the R direction.

The processes of measuring distances to a substrate, locating reference points, locating edges, locations, surfaces, features, or otherwise sensing or determining any physical characteristic of a substrate is referred to herein as scanning or mapping.

When end effector 32 is extended under substrate S as shown in FIG. 2B, the angular position of the end effector 32 can be aligned or adjusted one way or the other at the wrist 34, as indicated by arrows B, according to the angular misalignment θ of substrate S. The position of the end effector 32 can be aligned or adjusted in the R direction according to any misalignment of substrate S in that direction. Additionally, end effector 32 may be adjusted according to any detected misalignment of substrate S along direction X.

FIG. 2F shows a method of performing the above described measurements and adjustments. In block 46, sensors $40_1$ and $40_2$ are used to sense distances $D_1$ and $D_2$ and optionally the location of side edges $E_{S1}$ and $E_{S2}$ along the X direction. The position of end effector 32 is adjusted according to the distances and locations as shown in block 48. After the position adjustment, end effector 32 is used to pick up substrate S as shown in block 50.

Figure 2G:
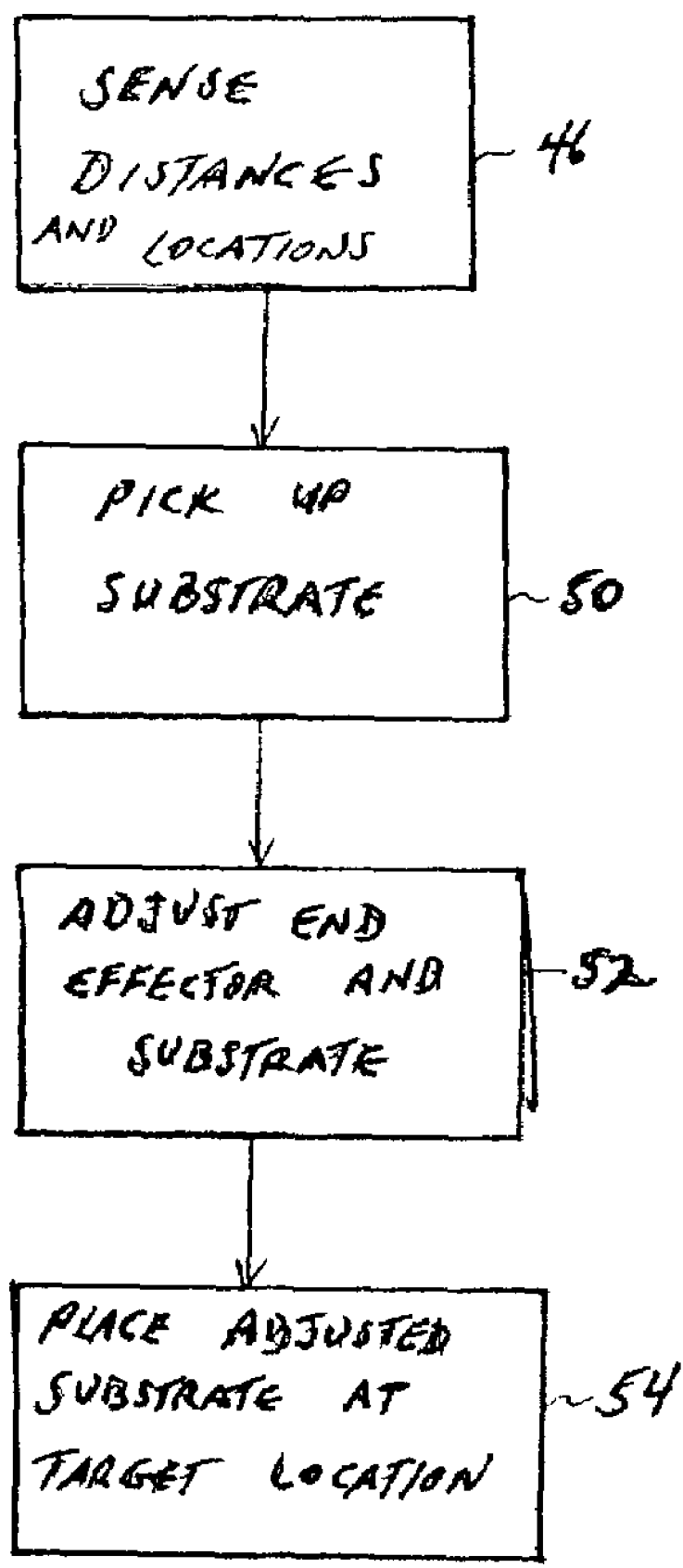
FIG. 2G is a flow chart of steps used to perform another method of the present invention.

FIG. 2G shows an alternate method wherein sensors $40_1$ and $40_2$ sense distances $D_1$, $D_2$ and may determine the location of side edges $E_{S1}$ and $E_{S2}$ with respect to the X direction (block 46). End effector 32 picks up substrate S, as indicated by block 50, but without any adjustment. As end effector 32 and substrate S are being moved from a source location to a target location, end effector 32 with substrate S thereon is adjusted as indicated by block 52. Substrate S is subsequently placed at the target location as indicated by block 54, the positioning of end effector 32 at the target location having been corrected for substrate S's initial misaligned position.

Controller 9 can also control the length of extension of end effector 32 from its home retracted position to its extended position based upon distance measurements $D_1$, $D_2$ to locate substrate S at a predetermined position on end effector 32. In addition, controller 9 can use sensors $40_1$ and $40_2$ to merely sense the presence or absence of substrate S, such as when the distances $D_1$ or $D_2$ are less than or more than a predetermined distance.

In this embodiment, end effector 32 is adapted to support individual substrates in a generally horizontal plane. The sensing path of sensors $40_1$ and $40_2$ is in an outward direction generally offset, but parallel to the plane. In an alternate embodiment the sensing path could be in the same plane, angled with respect to the plane, or offset and angled relative to the plane.

Sensors $40_1$ and $40_2$ can be used to sense the position of an individual substrate before the substrate is picked-up by end effector 32 or, alternatively, sensors $40_1$ and $40_2$ can be used to sense or scan the positions of multiple substrates and store the respective sensed positions in memory 7 for use when the individual substrates are to be subsequently picked-up by the end effector. Thus, unlike the systems described in U.S. Pat. Nos. 5,535,306 and 5,537,311, the present invention can be used to determine the misalignment of multiple substrates before the substrates are moved. End effector 32 may be moved very rapidly when there is no substrate on end effector 32 and may be used to scan multiple substrates over a short time period resulting in increased throughput. End effector 32 may also be used to scan a first substrate while carrying a second substrate.

Figures 3A, 3B:
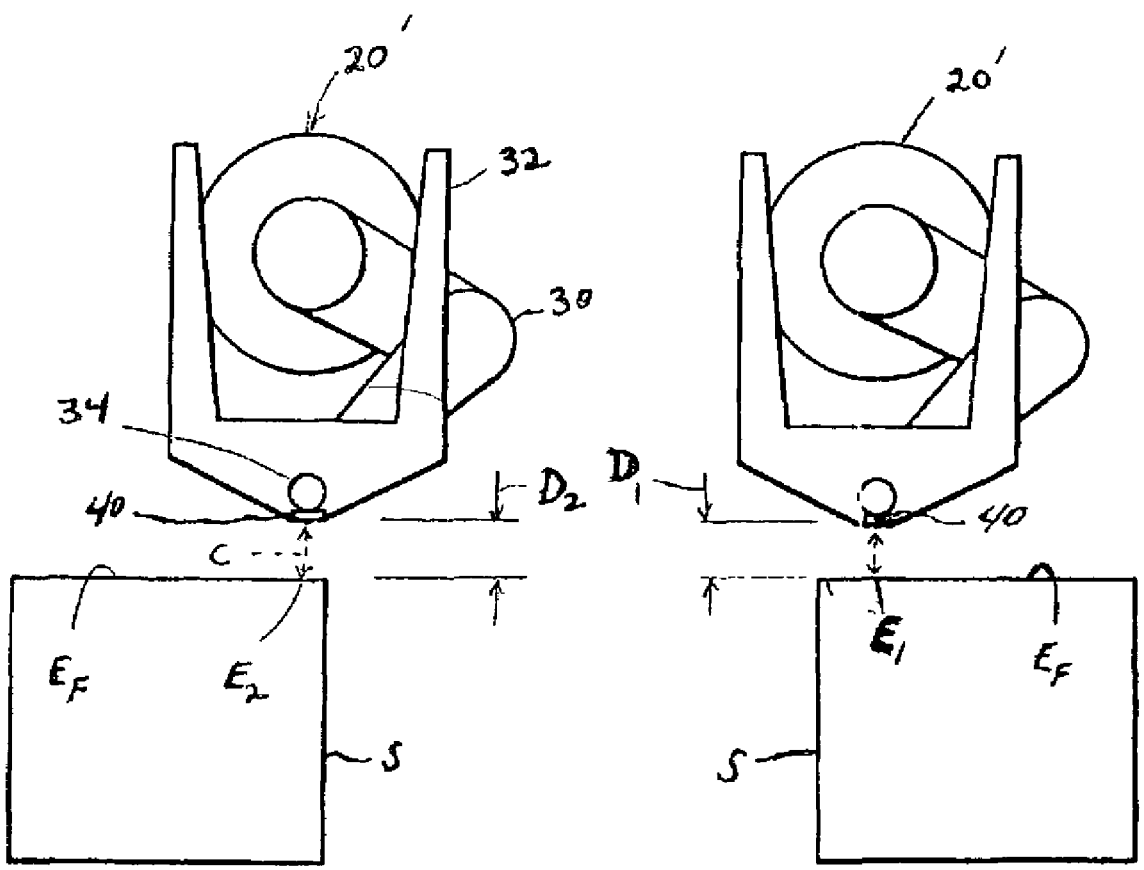
FIG. 3A is a schematic top plan view of an alternate embodiment of the substrate transport apparatus shown in FIG. 1A at a first scanning position relative to a substrate.
FIG. 3B is a schematic top plan view as in FIG. 3A at a second scanning position relative to the substrate.
Figure 3E:
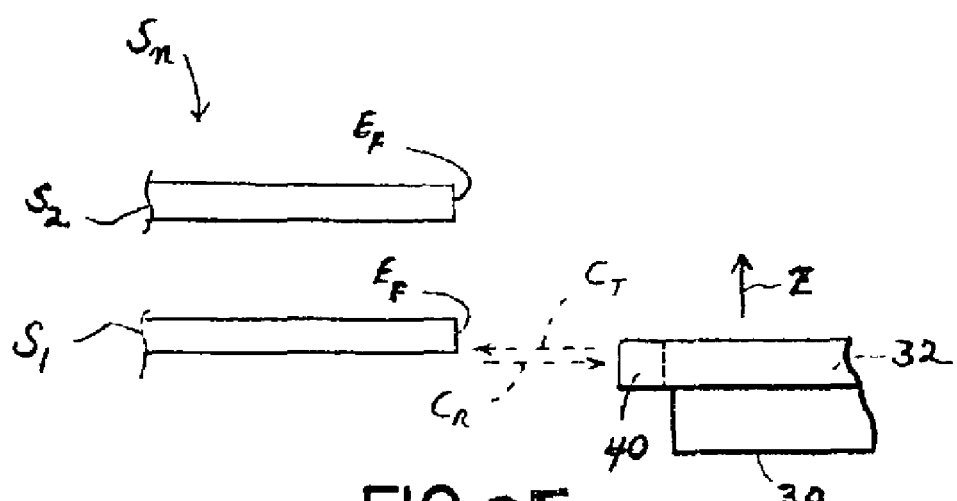
FIG. 3E is a schematic side elevational view of the substrate transport apparatus as shown in FIG. 3A with a stack of the substrate.
Figures 3C, 3D:
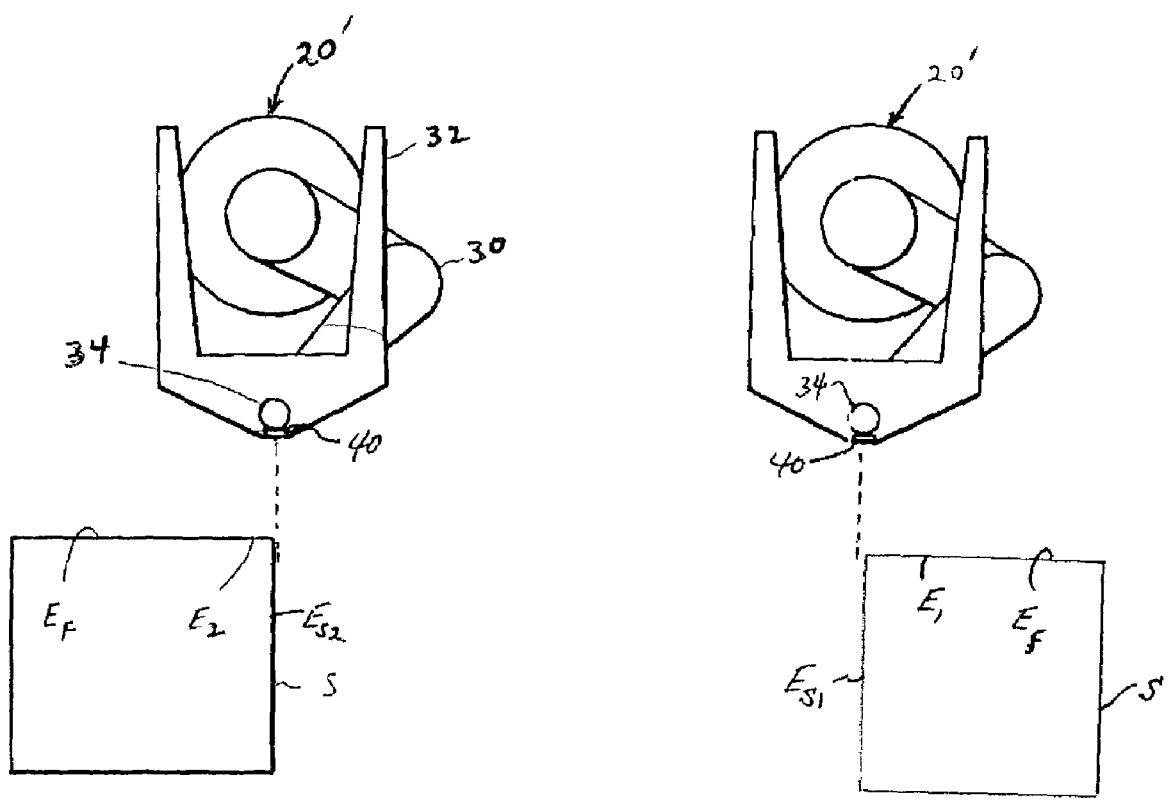
FIG. 3C is a schematic top plan view as in FIG. 3A at a third scanning position relative to the substrate.
FIG. 3D is a schematic top plan view as in FIG. 3A at a fourth scanning position relative to the substrate.

Referring now to FIGS. 3A-3C, an alternate embodiment will be described. In this embodiment the robot 20' comprises a single sensor 40. The sensor 40 is connected to the rear end of the end effector 32 proximate the wrist location 34. The wrist location comprises a rotatable connection of the end effector 32 to the arm 30. The sensor 40 has a sensing path C in a generally horizontal plane in an outward direction from the rear end of the end effector 32. As seen best in FIG. 3E, the sensing path actually comprises transmitted energy $C_T$ and reflected energy $C_R$. When the transmitted energy $C_T$ from the sensor 40 strikes the edge $E_F$, the energy is reflected back to the sensor as reflected energy $C_R$.

During the scanning of substrate S, end effector 32 has its rear end facing substrate S such that sensor 40 faces front edge $E_F$ of substrate S. With this embodiment sensor 40 is used to determine distance $D_2$ between sensor 40 and reference point $E_2$. Robot 20 can then be moved to a new location as indicated by FIG. 3B and sensor 40 can be used to determine distance $D_1$ between sensor 40 and reference point $E_1$. As shown in FIG. 3C, robot 20 may then be moved to a location such that sensor 40 detects side edge $E_{S1}$ in manner similar to that described above with respect to FIG. 2D. Then, as shown in FIG. 3D, robot 20 may be moved to a location where sensor 40 detects side edge $E_{S2}$ in a manner similar to that described above with respect to FIG. 2E. It should be understood that distances $D_1$ and $D_2$ and side edges $E_{S1}$ and $E_{S2}$ may be detected in any order.

As noted above, multiple substrates can be scanned as a group. Thus, for the stack of substrates $S_n$, shown in FIG. 3E, a first substrate $S_1$ is scanned and then the robot 20 is moved vertically in a Z direction such that a second substrate $S_2$ can be scanned. In a preferred method, reference points $E_1$ for all substrates in the stack $S_n$ are scanned and then robot 20 is moved to subsequently scan reference points $E_2$ for all substrates, side edges $E_{S1}$ and then side edges $E_{S2}$. Sensor 40 can scan as the end effector is being vertically moved up or down. The embodiment of a single sensor 40 at wrist location 34 may also be used for scanning the characteristics of an individual substrate before pick-up.

Figure 4A:
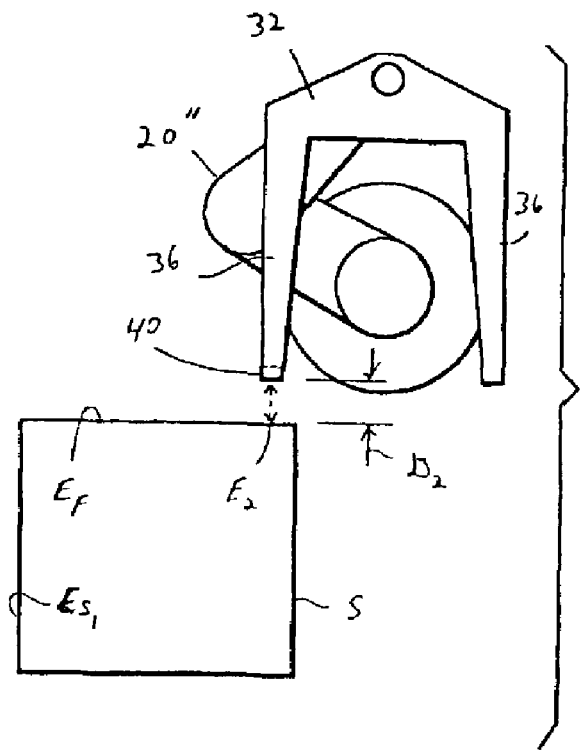
FIG. 4A is a schematic top plan view as in FIG. 3A of an alternate embodiment of the present invention having a sensor at a front tip of one of the arms of the end effector and the end effector at a first scanning position relative to the substrate.
Figure 4B:
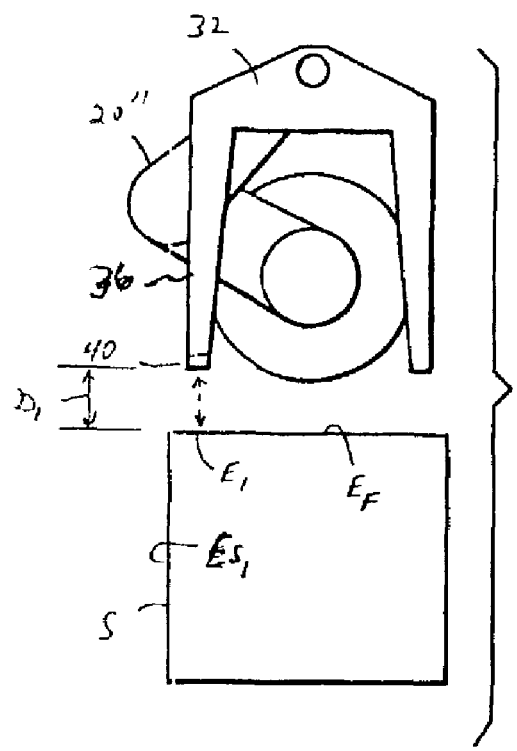
FIG. 4B is a schematic top plan view as in FIG. 4A with the end effector at a second scanning position.
Figure 4E:
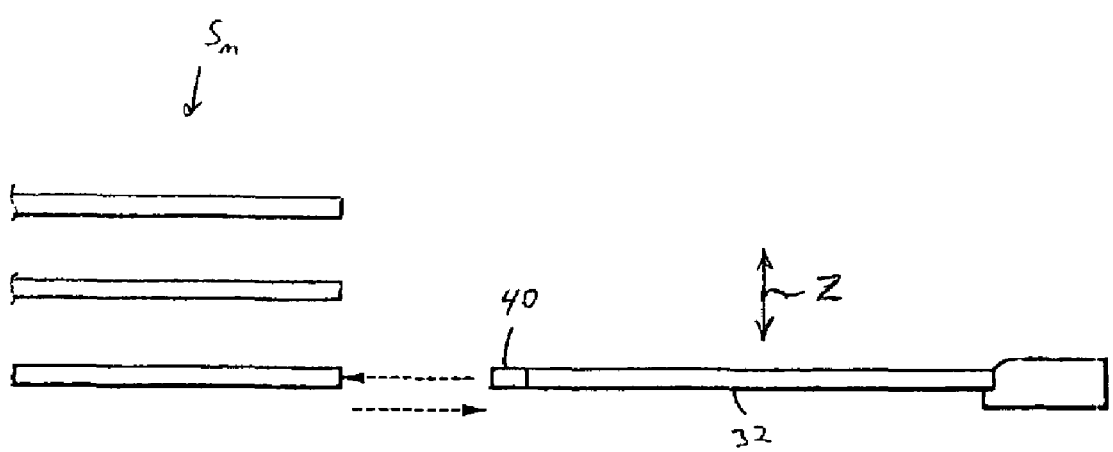
FIG. 4E is a schematic side elevational view of the substrate transport apparatus as shown in FIG. 4B with a stack of the substrates.
Figure 4C:
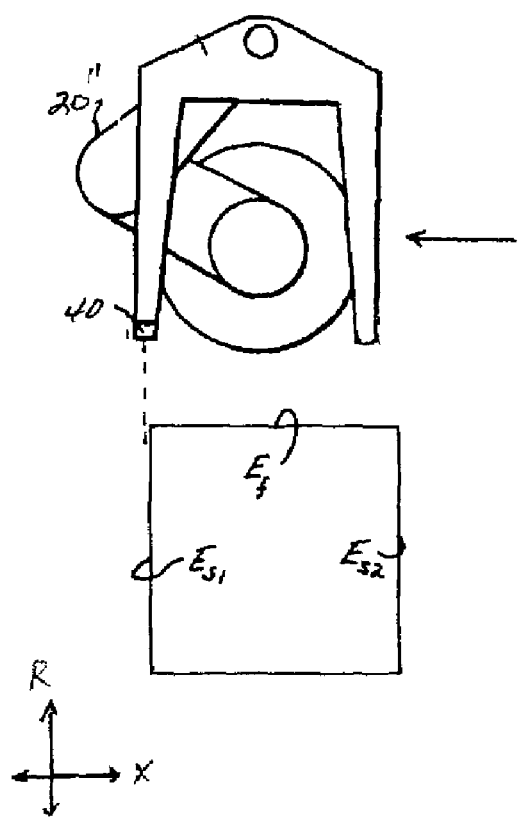
FIG. 4C is a schematic top plan view as in FIG. 4A with the end effector at a third scanning position.
Figure 4D:
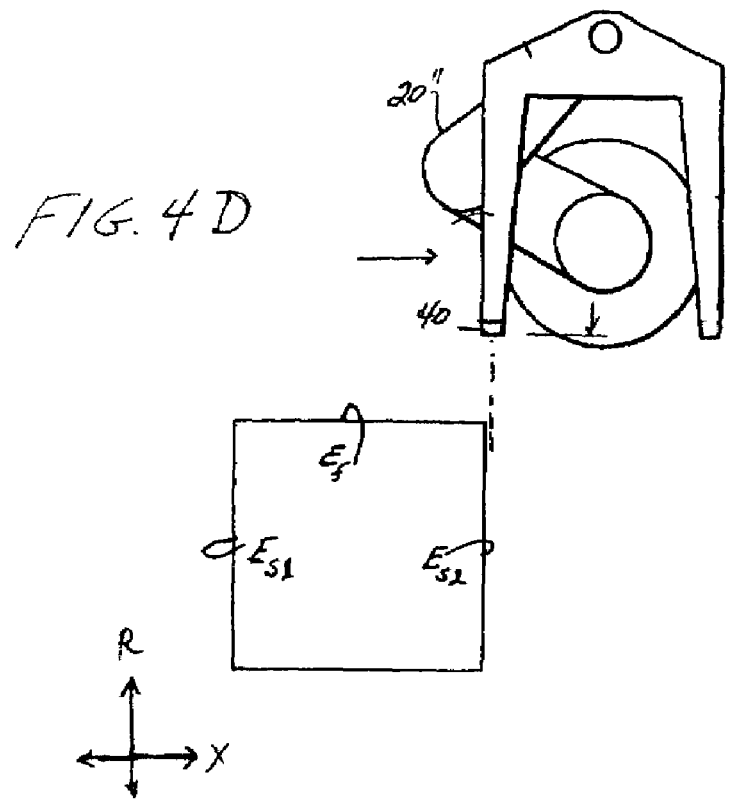
FIG. 4D is a schematic top plan view as in FIG. 4A with the end effector at a fourth scanning position.

Referring now to FIGS. 4A and 4B, another alternate embodiment will be described. In this embodiment robot 20" comprises a single sensor 40 located on end effector 32. Sensor 40 is located at a distal tip at the front of one of arms 36. With this embodiment, the front end of end effector 32 is able to face front edge $E_F$ of substrate S during sensing of the position of front edge $E_F$. Sensor 40 is used to determine distance $D_2$ to reference point $E_2$. Robot 20" is then moved to another position as shown in FIG. 4B where sensor 40 can then be used to determine distance $D_1$ to reference point $E_1$. As shown in FIG. 4C, robot 20" may then be moved to a location such that sensor 40 detects side edge $E_{S1}$. Then, as shown in FIG. 4D, robot 20" may be moved to a location where sensor 40 detects side edge $E_{S2}$.

With this embodiment, when sensor 40 is finished sensing distances $D_1$, $D_2$ and the locations of side edges $E_{S1}$ and $E_{S2}$, end effector 32 merely needs to be moved slightly vertically down for subsequent extension under substrate S for picking-up the substrate. Referring also to FIG. 4E, the embodiment shown in FIGS. 4A and 4B can also be used for sensing individual characteristics of a batch of substrates $S_n$ by vertically moving end effector 32 along the Z direction.

In another embodiment, the alignment system can also comprise a distance measurement sensor 58 connected to frame 16, as shown in FIG. 1. When individual substrates are being moved or removed from cassettes 26, sensor 58 can sense the distance to at least one of side edges $E_{S1}$ or $E_{S2}$ (see FIG. 4C) of substrate S. This information can be used with both distance measurements $D_1$, $D_2$ or only one of distance measurements $D_1$ or $D_2$ to determine the amount or degree of misalignment of substrate S. The position or trajectory of end effector 32 may then be adjusted, either while end effector is stationary, or while end effector is moving.

Figure 5A:
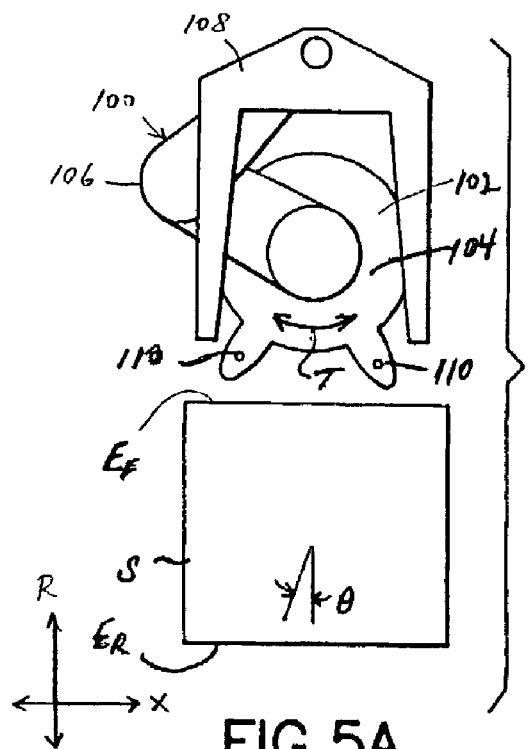
FIG. 5A is a schematic top plan view of an alternate embodiment of the substrate transport apparatus with sensors on a front location of a turret.

Referring now to FIG. 5A, another alternate embodiment is shown. In this embodiment, robot 100 comprises a drive section 102 with a rotatable turret 104, a movable arm 106, and an end effector 108 for moving substrate S. In this embodiment turret 104 comprises two sensors 110. Sensors 110 are rotated with turret 104 when the turret is rotated. In this embodiment when robot 100 is in the home retracted position, sensors 110 are located in the vicinity of the front end of end effector 108. Sensors 110 point in an upward direction.

When end effector 108 picks up substrate S and moves the substrate towards the robot's home position, front edge $E_F$ passes over sensors 110. Controller 9 is programmed to determine misalignment of front edge $E_F$ based upon signals from sensors 110. More specifically, when one of sensors 110 senses the edge $E_F$ before the other sensor, the time between the sensing of edge $E_F$ by the two sensors 110 is determined and the speed of end effector 108 is used to determine the misalignment of edge $E_F$ and, thus, the misalignment of substrate S.

In a preferred embodiment, sensors 110 are distance measurement sensors similar to sensors 40. Controller 9 is programmed to determine when edge $E_F$ passes over sensors 110 when the reflected energy is below or within a predetermined maximum distance. However, any suitable sensor and alignment system controller programming could be provided. By locating sensors 110 on rotatable turret 104 the sensors 110 can be used for substrate alignment anytime a substrate is present on end effector 108. Alignment may be performed as substrates S are moved out of cassettes 26 or when substrates S are moved out of load locks 12 by robot 100.

Sensors 110 are able to move with turret 104 in direction T and in a vertical Z direction. Sensors 110 may also move in the X direction when car 18 is moved. In this embodiment, end effector 108 may be moved independently of sensors 110. Sensors 110 can be used to determine both the angle θ misalignment of front edge $E_F$ as well as any offset in the R direction of front edge $E_F$. Sensors 110 could also be used to determine trailing edge or rear edge ER offset/misalignment as rear edge ER passes over sensors 110.

Figure 5B:
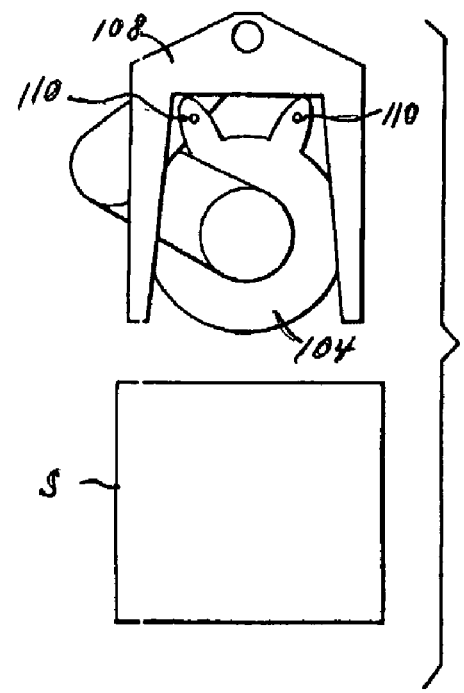
FIG. 5B is a schematic top plan view of another alternate embodiment with sensors on a rear location of the turret.

FIG. 5B shows an alternate embodiment wherein sensors 110 are connected to turret 104', but located proximate a rear end of end effector 108 when end effector 108 is at its home retracted position.

Figure 6A:
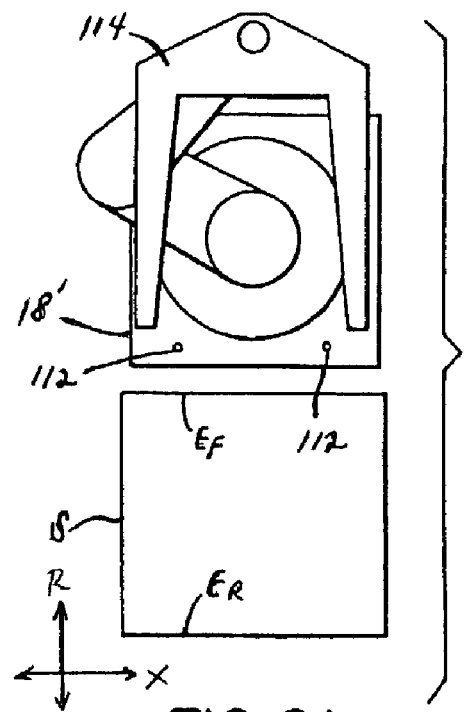
FIG. 6A is a schematic top plan view of an alternate embodiment of the substrate transport apparatus with sensors on a front location of a horizontally movable car of the transport apparatus.
Figure 6B:
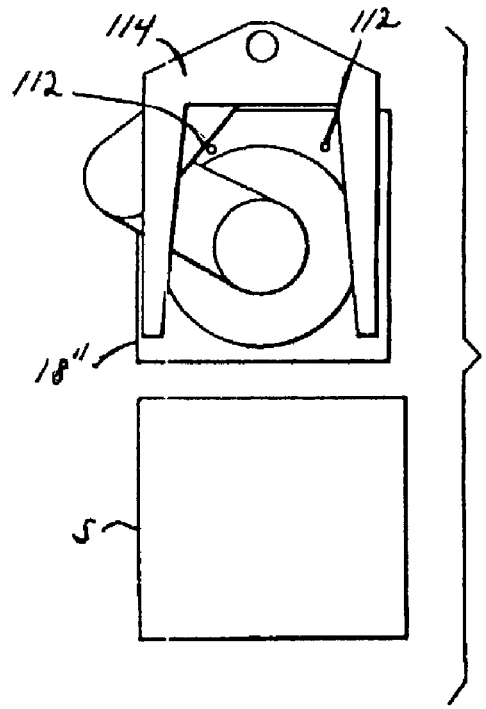
FIG. 6B is a schematic top plan view of another alternate embodiment with sensors on a rear location of the car.

FIG. 6A shows another embodiment where transfer device 11 comprises two sensors 112 located on car 18'. Sensors 112 can obtain leading edge $E_F$ and/or trailing edge ER data as substrate S is moved by end effector 114. In this embodiment, sensors 112 are located at the top side of car 18' facing an upward direction proximate a side of the car nearest cassettes 26. Referring to FIG. 6B, an alternate embodiment is shown wherein sensors 112 are located proximate a side of car 18" nearest load locks 12.

Figure 7A:
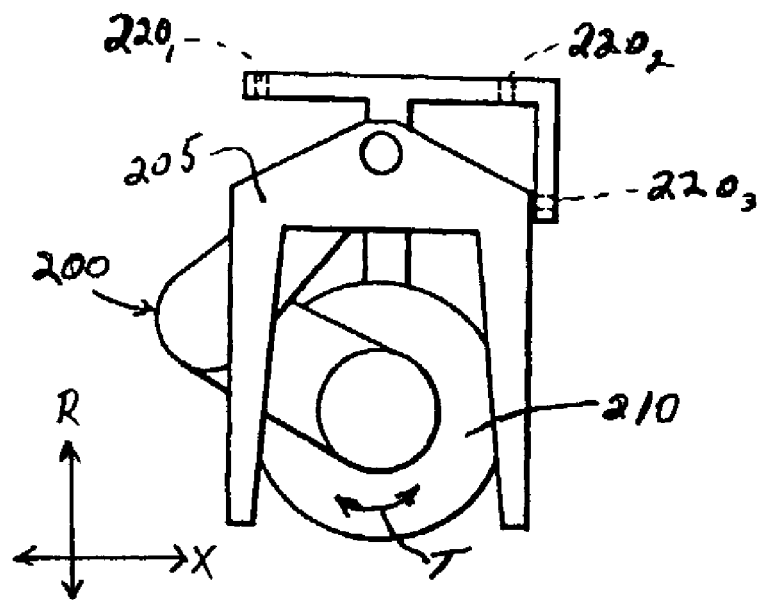
FIG. 7A is a schematic top plan view of another alternate embodiment.
Figure 7B:
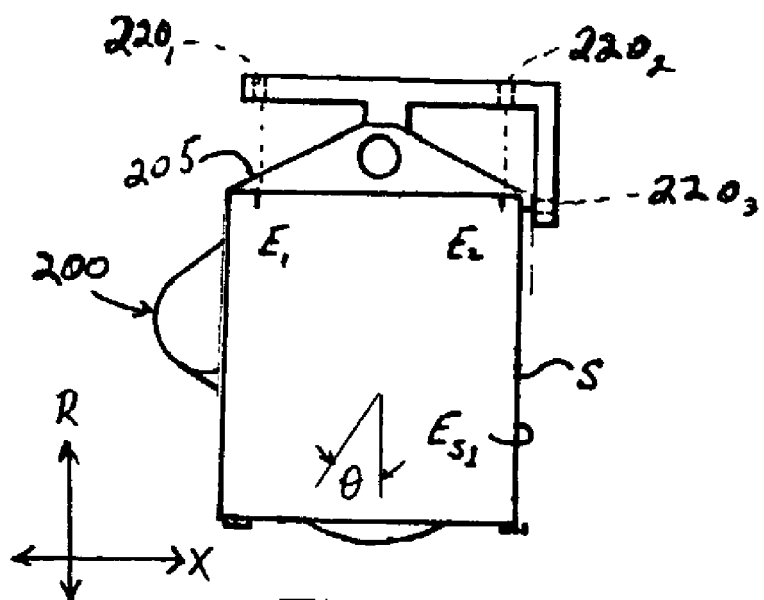
FIG. 7B is a schematic top plan view as in FIG. 7A with the substrate having been picked up by the end effector and the end effector moved back to a retracted home position.

FIGS. 7A and 7B show yet another embodiment where transfer device 11 comprises robot 200 with end effector 205 and three sensors $220_1$ $220_2$ $220_3$ connected to robot turret 210. Sensors $220_1$ $220_2$ $220_3$ are positioned to scan substrate S when robot 200 moves to its home retracted position as shown in FIG. 7B. As such, sensors $220_1$ and $220_2$ measure the distance to reference points $E_1$ and $E_2$, respectively, and sensor $220_3$ measures the distance to side edge $E_{S1}$. As discussed above, the measurements allow controller 9 to determine any misalignment of substrate S. Controller 9 may use the distances to reference points $E_1$ and $E_2$ to calculate misalignment in the R direction as well as any angular misalignment θ. The distance to side edge $E_{S1}$ is used to calculate any misalignment in the X direction. The use of three sensors is advantageous in that the three distances may be determined simultaneously, thus increasing the speed of the scanning and adjustment process. Sensors $220_1$, $220_2$, $220_3$ could alternatively be connected to the base of robot 200 and/or car 18.

Figure 8A:
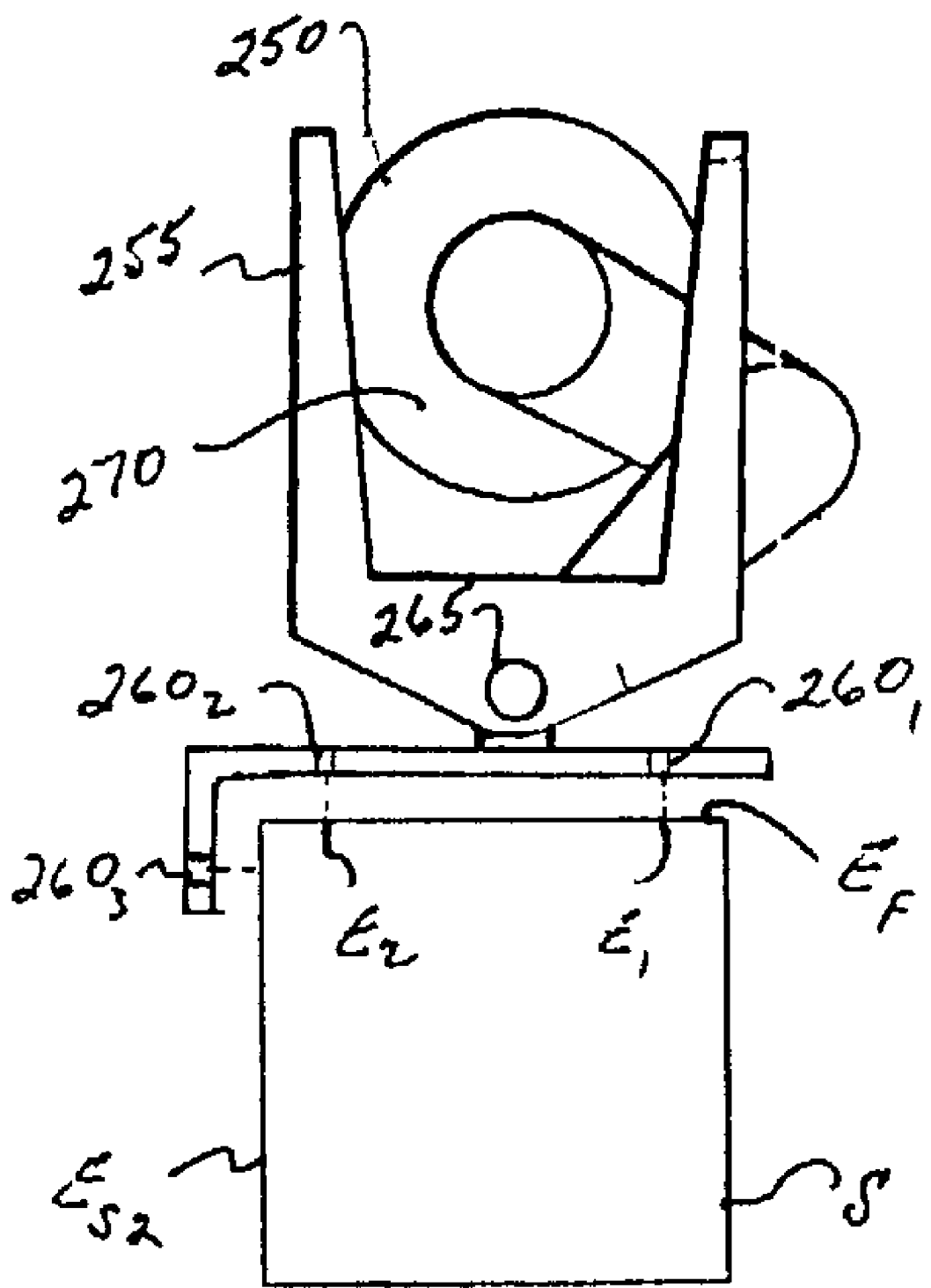
FIG. 8A is a schematic top plan view of another alternate embodiment of the substrate transport apparatus and a substrate.
Figure 8D:
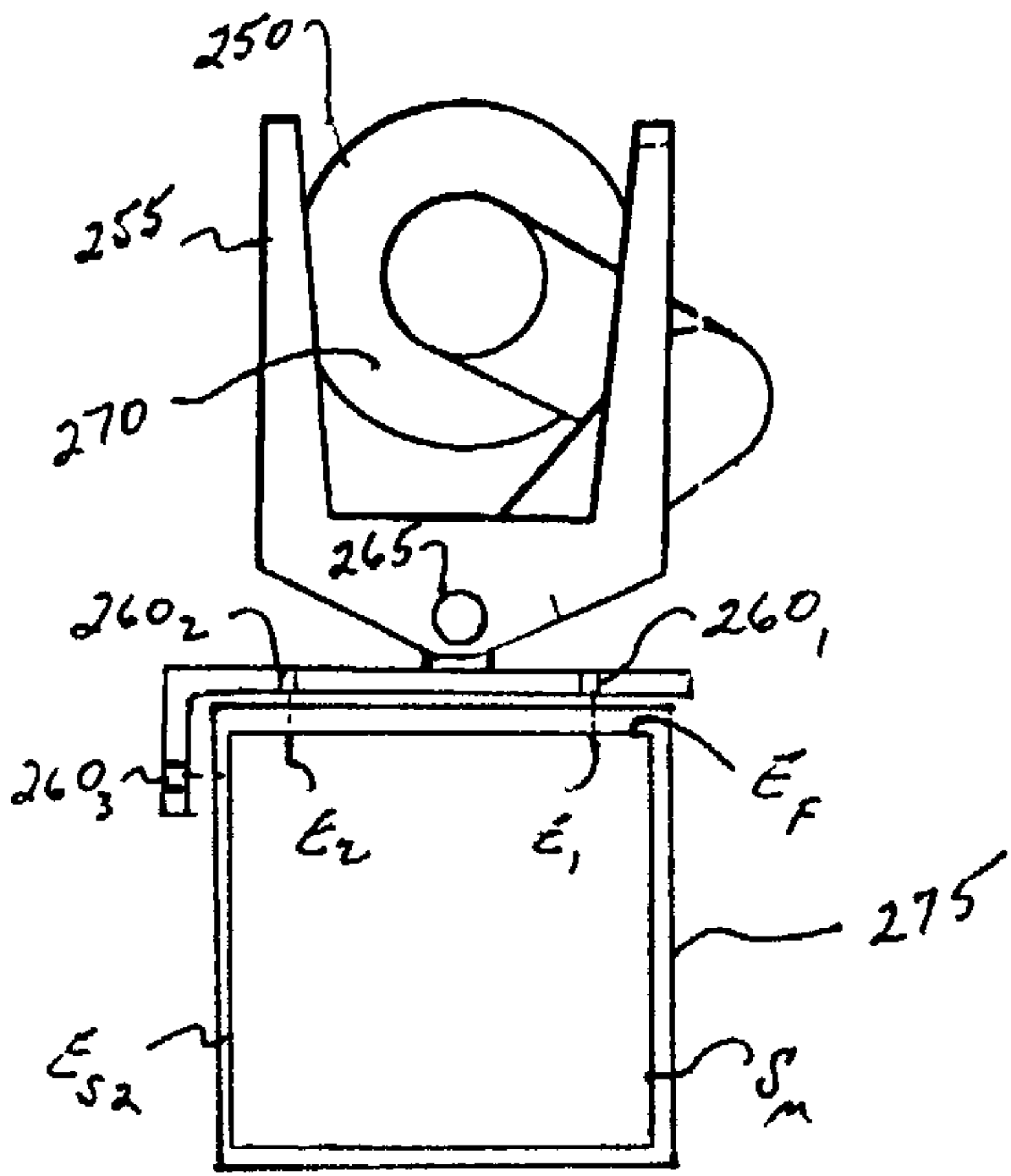
FIG. 8D is a schematic top plan view of another embodiment of an end effector and the substrate transport apparatus.
Figure 8C:
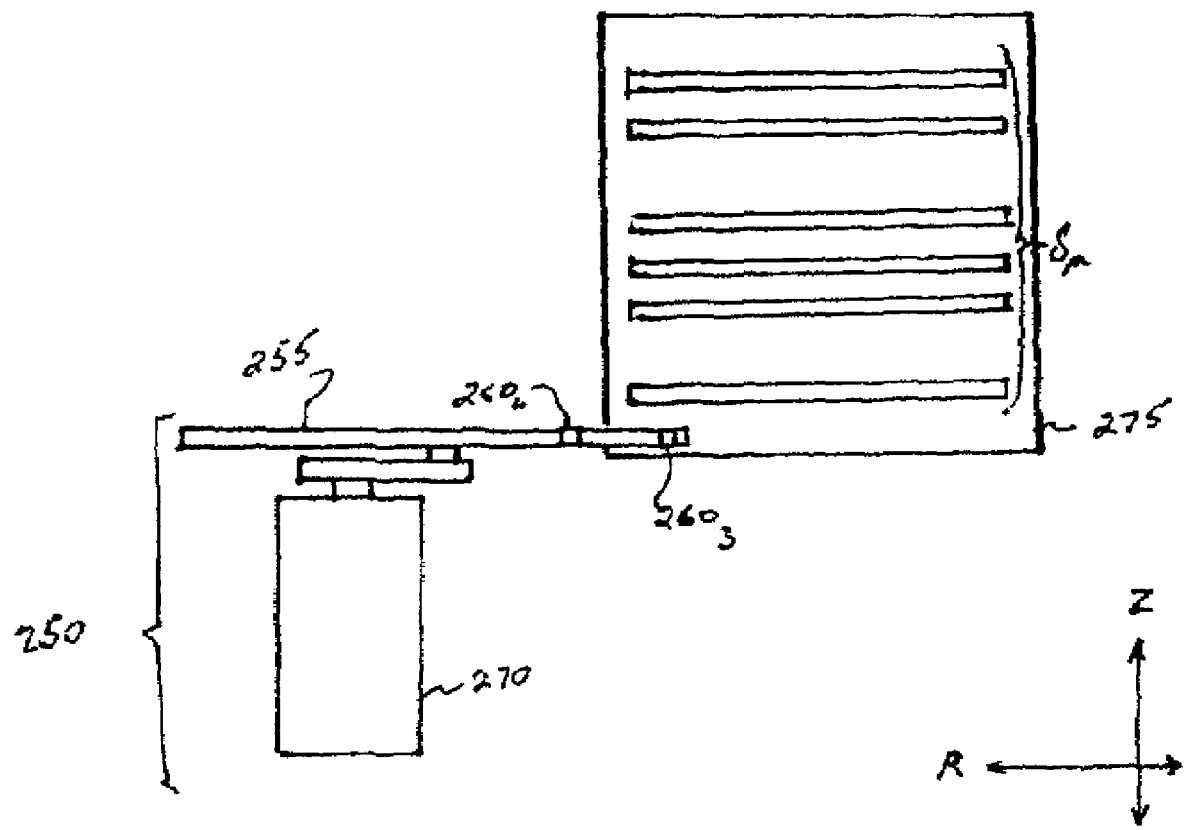
FIG. 8C is a schematic side plan view of the apparatus and cassette as in FIG. 8B.
Figure 8D:
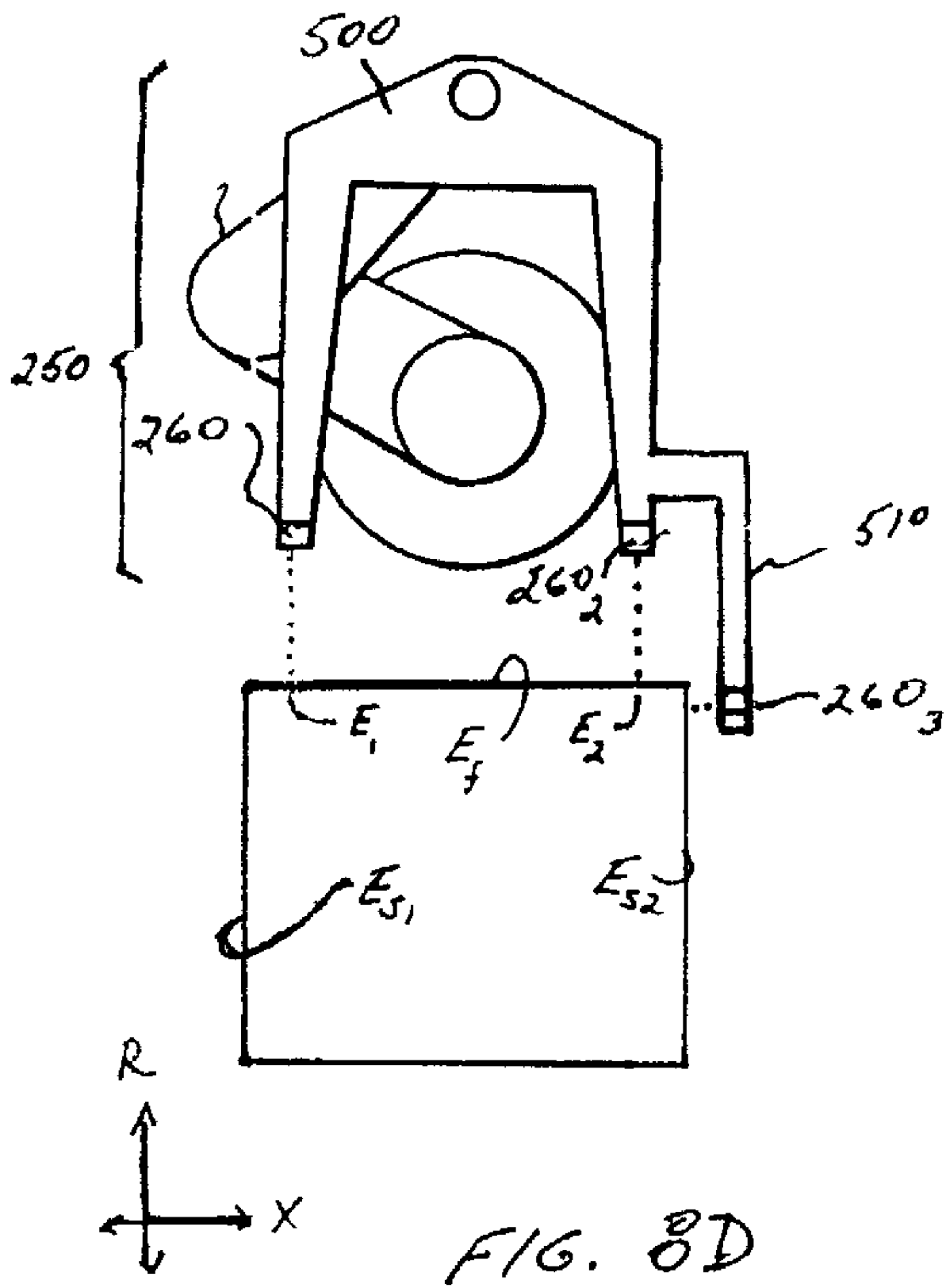

FIGS. 8A-8C show still another embodiment, including robot 250 with robot drive 270 and end effector 255. Robot 250 has a wrist 265 comprising a rotatable connection of end effector 255 to robot drive 270. Three sensors $260_1$, $260_2$, $260_3$ may be mounted on the rear end of effector 255, proximate wrist 265. Sensors $260_1$ and $260_2$ may be located to detect the distances to reference points $E_1$ and $E_2$ respectively, while sensor $260_3$ may be located to detect the distance to side edge $E_{S2}$.

In this embodiment, sensors $260_1$, $260_2$, $260_3$ may be mounted on a generally L shaped frame 280 where sensors $260_1$ and $260_2$ are positioned to scan in essentially parallel directions while sensor $260_3$ is positioned to scan in a direction essentially perpendicular to the scanning direction of sensors $260_1$ and $260_2$. While sensors $260_1$ and $260_2$ are shown positioned equidistant to wrist 265, it should be understood that they may be positioned at any known location along frame 280 as long as they are capable of measuring the distances to reference points $E_1$ and $E_2$, respectively. Sensor $260_3$ may also be positioned at any location along frame 280 as long as it is capable of measuring the distance to side edge $E_{S1}$ or $E_{S2}$.

It should also be understood that frame 280 is shown as an example of a device for mounting sensors $260_1$, $260_2$, $260_3$, and that the sensors may be positioned, located on, or supported by any type of device suitable for positioning the sensors so as to allow appropriate scanning and measurement of substrates. FIG. 8D shows an example of one embodiment where robot 250 has an end effector 500 with an extension 510. Sensors $260_1$ and $260_2$ are mounted on the ends of end effector 500, and sensor $260_3$ is mounted on extension 510.

Returning to the embodiments shown in FIGS. 8A-8C, for scanning, end effector 255 is turned so that sensors $260_1$, $260_2$ face front edge $E_F$ of substrate S. Sensors $260_1$ and $260_2$ may be used to determine the distances to reference points $E_1$ and $E_2$, respectively, on front edge $E_F$. Sensor $260_3$ may be used to determine the distance to side edge $E_{S2}$. Similar to the embodiment shown in FIGS. 7A and 7B, the use of three sensors allows measurements to be made simultaneously, thus increasing the speed of scanning the substrates and adjustment of the end effector position as related to the substrate position.

FIGS. 8B and 8C show an embodiment where multiple substrates $S_n$ are held in a cassette 275. In this example, the substrates are stacked in the Z direction inside cassette 275. As shown for example purposes in FIG. 8C, one or more support shelves of the cassette 275 may be empty, that is one or more support shelves may not have a substrate supported thereon. As sensors $260_1$, $260_2$, $260_3$ move in the Z direction relative to cassette 275, they can be used to detect the presence or lack thereof of substrates on the support shelves.

A substrate $S_n$ may be scanned by moving end effector along the Z direction. Scanning may also be performed by moving cassette 275 in the Z direction, either alone or in combination with Z direction movement of end effector 255. Scanning may be performed while end effector travels in continuous motion, or end effector may be positioned proximate a substrate where scanning occurs, and then may be positioned proximate the next substrate to be scanned. By using any of these techniques alone or in combination, an individual substrate may be scanned, or a number of substrates may be scanned. Thus, the location and any misalignment of each substrate $S_n$ may be determined while it resides in cassette 275.

During the scanning process, when a substrate is detected, sensors $260_1$, $260_2$, $260_3$ may register the distances to reference points $E_1$, $E_2$, and to side edge $E_{S2}$, respectively, substantially simultaneously to establish the position and orientation of a substrate on a support shelf. Simultaneous presence, position, and orientation detection allows scanning at high speed, leading to significantly increased throughput.

Figure 9:
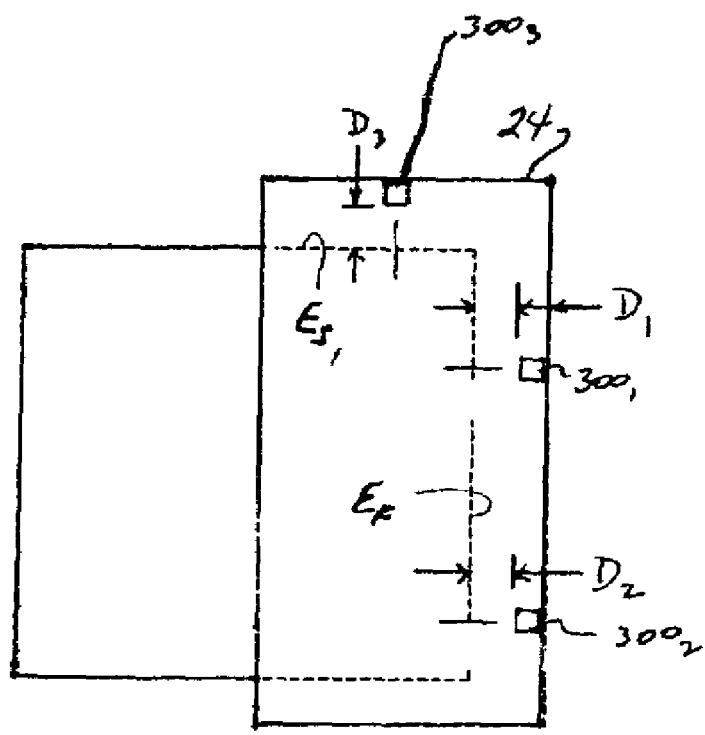
FIG. 9 is a schematic view of a stationary substrate aligner having three sensors.

FIG. 9 shows an alternate embodiment where transfer device 11 shown in FIG. 1 comprises an alignment station 24. As shown in FIG. 9, alignment station 24 includes three sensors $300_1$, $300_2$, $300_3$. Sensors $300_1$, $300_2$ may be used for sensing front edge $E_F$ of substrate S, while sensor $300_3$ may be used for sensing side edge $E_{S1}$ of the substrate. A robot or other transport mechanism (not shown) may be used to position substrate S proximate alignment station 24 where the location and any misalignment of the substrate may be determined.

Figure 10:
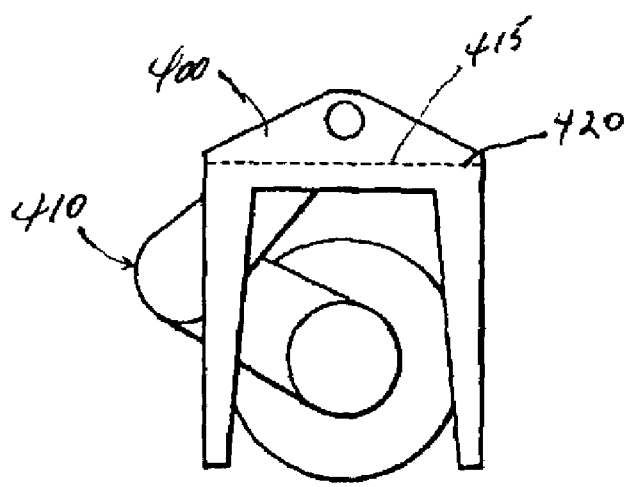
FIG. 10 is a schematic top plan view of another alternate embodiment of the substrate transport apparatus with a line or bar sensors on the end effector.

FIG. 10 shows another embodiment. In this embodiment, end effector 400 of robot 410 includes a sensor 415. Sensor 415 comprises a sensing line 420 across a top side of end effector 400. Sensing line 420 may be comprised of multiple sensors aligned in an array or a straight line to sense front edge $E_F$ of substrate S as the substrate passes over sensing line 420. In a preferred embodiment sensing line 420 is comprised of multiple capacitive sensors that sense in a direction away from end effector 400. In another embodiment, sensing line 420 may include two capacitive sensors.

The present invention can be used to increase throughput of substrates through the system by streamlining the alignment and adjustment processes for accurate substrate placement. The present invention provides location and alignment information at least in two perpendicular directions and in an angular direction. The present invention also provides a non-contact scan of the substrate which reduces the risk of particle contamination.

The non-contact scan may also be used to determine if any dimensions of a substrate have changed, for example, during processing. For instance, known, or previously stored dimensions of a substrate may be compared to actual dimensions to determine whether a substrate has warped, perhaps due to excessive temperature excursions during processing. A similar comparison may be made to determine if a substrate has been broken or otherwise damaged and may be unacceptable for processing.

It should be understood that the sensors can be located at any suitable location or may be located at multiple different locations. For example, sensors are described above as being at the wrist, being at the front tips of the end effector arm(s), being on the robot turret, being on the robot transport car, and being stationary on the frame 16.

It should be further understood that the sensors may be positioned in any location and in any combination of locations suitable for performing the functions described herein. It should also be understood that the sensors can be pointed or oriented in any suitable direction. For example, one or more sensors may point or have a sensing path in a forward direction, a rearward direction, or a side direction. One or more sensors may also be positioned such that while a first substrate is located on the end effector, the one or more sensors sense a second substrate that is not located on the end effector.

The present invention can use sensing in an outward direction from the end effector or the robot which does not intersect a substrate on the end effector when the end effector is at a home retracted position, or does not intersect a substrate on the end effector wherever the end effector is located.

For particular types of sensors, reflective surfaces may be used in combination with one or more sensors to accomplish a scan. For example, a sensor could be located on frame 16 and mirrors positioned on end effector 32 (FIG. 2A) rather than the sensor being directly on the end effector. Beam splitters and multiple detectors may also be used to sense one or more reference points, locations, or edges of the substrate in combination with a single emitter. Thus, portions of one or more sensors may be spaced from each other, or remotely located from each other. The sensors can also be movable without being on the end effector, such as being on the robot or the robot transport.

During scanning of substrates and storing position data in memory, the method can use a single pass scanning mode (such as when the end effector has two sensors as in FIG. 2A) or can use a multi-pass scanning mode (such as when the end effector has one sensor as in FIGS. 3A-3C and 4A-4C). Features of the present invention can be used for any of the three general aligning methods noted above; adjust end effector before pick-up, adjust end effector after pick-up to place substrate at target location at a corrected position, use of a separate aligner station, or any combination of these general methods.

The use of the features of the present invention is not limited to the substrate transfer device 11. As shown in FIG. 1, features of the present invention may be incorporated in substrate processing device 14. For example, substrate transport robot 15 could be provided with an alignment correction system as described above with sensors 40' located on robot 15 or sensors 40" located in front of one or more of substrate processing chambers 17.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. In a substrate transport apparatus comprising a robot arm assembly and an end effector connected to the robot arm assembly at a wrist location, wherein the improvement comprises:
    a substrate sensor located proximate the wrist location for sensing a position of a substrate relative to the sensor having a sensing path essentially parallel to a plane of the substrate when supported by the end effector; and
    a controller for controlling the end effector to automatically compensate for any misalignment of the substrate using input from the substrate sensor,
    wherein the sensor comprises a sensing path in a rearward direction from the end effector.

2. The apparatus as in claim 1 wherein the sensor comprises a distance measuring sensor.

3. The apparatus as in claim 1 wherein the distance measuring sensor comprises a laser.

4. The apparatus as in claim 1 further comprising a horizontal movement system, wherein the substrate sensor is positioned to detect a first edge of the substrate and the horizontal movement system operates to horizontally move the substrate sensor for detecting a second edge of the substrate.

5. In a substrate transport apparatus comprising a drive section and a movable arm assembly connected to the drive section, the arm assembly comprising a robot arm connected to the drive section and an end effector connected to the robot arm, wherein the improvement comprises:
    at least one substrate sensor connected to the substrate transport apparatus and spaced from the end effector, wherein the end effector can be moved without moving the sensor, and wherein the sensor is mounted to a movable portion of the drive section; and
    a controller for moving the end effector, and to automatically adjust the end effector to compensate for any misalignment of the substrate using the input from the at least one substrate sensor.

6. The apparatus as in claim 5 wherein the movable portion of the drive section comprises a rotatable turret and wherein the sensor is mounted to the turret.

7. The apparatus as in claim 5 wherein the movable portion of the drive section comprises a horizontally movable car and wherein the sensor is mounted to the car.

8. The apparatus as in claim 5 wherein the sensor is a distance sensor for measuring a distance of a substrate from the sensor.

9. The apparatus as in claim 5 wherein the sensor comprises a CCD sensor.

10. The apparatus as in claim 5 wherein the sensor comprises a capacitive sensor.

11. In a system for aligning a substrate after the substrate has been picked up by a substrate holder, wherein the improvement comprises:
    at least three sensors for sensing edges of the substrate, wherein the substrate holder is moved based at least partially upon input from the three sensors; and
    a controller for controlling the substrate holder to compensate for any misalignment of the substrate using input from at least one of the three sensors,
    wherein the sensors are mounted on a rotatable turret of a robot comprising the substrate holder.

12. The system as in claim 11 wherein the sensors are mounted to a car that horizontally moves a robot which comprises the substrate holder.

13. The system as in claim 11 wherein the sensors are located at a stationary aligner station, wherein the substrate holder is movable into and out of the stationary aligner station.

14. The system as in claim 11 wherein the sensors are CCD sensors.

15. In a system for aligning a substrate holder with a substrate, wherein the improvement comprises:
    at least one capacitive sensor on the substrate holder for sensing an edge of the substrate, wherein the substrate holder is mounted on a movable portion of a substrate transport apparatus and is moved based at least partially upon input from the sensor, and wherein the sensor comprises a sensing line of multiple sensors aligned in an array across a top section of the substrate holder; and a controller for controlling the end effector to compensate for any misalignment of the substrate based on an output of the multiple sensors.

16. A substrate transport apparatus comprising:

a first sensor for sensing a first distance to a first reference point on a first edge of a substrate;

a second sensor for simultaneously sensing a second distance to a second reference point on the first edge;

a third sensor for simultaneously sensing a third distance to a second edge of the substrate;

circuitry for determining an amount of misalignment of the substrate from the third distance; and a frame on which the first, second, and third sensors are mounted, wherein the frame is mounted to a rear end of an end effector of the transport apparatus.

* * * * *